United States Patent
Reggiani et al.

(10) Patent No.: US 6,981,201 B2
(45) Date of Patent: Dec. 27, 2005

(54) PROCESS FOR DECODING SIGNALS AND SYSTEM AND COMPUTER PROGRAM PRODUCT THEREFORE

(75) Inventors: Luca Reggiani, Ferrara (IT); Giorgio Betti, Pogliano Milanese (IT); Filippo Brenna, Villa Raverio (IT); Angelo Dati, Abbiategrasso (IT); Davide Giovenzana, Monza (IT); Augusto Rossi, Pavia (IT)

(73) Assignee: STMicroelectronics S.R.L., Agrate Brianza (IT)

(*) Notice: Subject to any disclaimer, the term of this patent is extended or adjusted under 35 U.S.C. 154(b) by 385 days.

(21) Appl. No.: 10/246,794

(22) Filed: Sep. 18, 2002

(65) Prior Publication Data
US 2003/0066021 A1   Apr. 3, 2003

(30) Foreign Application Priority Data
Oct. 3, 2001   (EP)   ................................. 01830623

(51) Int. Cl.$^7$ ........................................... H03M 13/03
(52) U.S. Cl. ................................................... 714/786
(58) Field of Search ................................ 714/746, 786, 714/794–795, 769, 780, 752; 375/262

(56) References Cited

U.S. PATENT DOCUMENTS

| | | | |
|---|---|---|---|
| 5,485,472 A | 1/1996 | Fredrickson | |
| 5,809,080 A | 9/1998 | Karabed et al. | |
| 5,889,823 A | 3/1999 | Agazzi et al. | |
| 5,961,658 A * | 10/1999 | Reed et al. | 714/746 |
| 6,061,823 A | 5/2000 | Nara | |
| 6,185,173 B1 | 2/2001 | Livingston et al. | |
| 6,185,175 B1 | 2/2001 | Zook | |
| 6,233,714 B1 * | 5/2001 | Hassner et al. | 714/794 |
| 6,530,060 B1 * | 3/2003 | Vis et al. | 714/792 |
| 6,587,987 B1 * | 7/2003 | Vasic et al. | 714/780 |

FOREIGN PATENT DOCUMENTS

| | | |
|---|---|---|
| WO | WO 00/07187 | 2/2000 |

* cited by examiner

*Primary Examiner*—Shelly Chase
(74) *Attorney, Agent, or Firm*—Carol W. Burton, Esq.; William J. Kubida, Esq.; Hogan & Hartson L.L.P.

(57) ABSTRACT

A system for decoding digital signals subjected to block coding includes a post-processor that corrects the codewords affected by error, identifying them with the most likely sequence that is a channel sequence and that satisfies a syndrome check. The post-processor is a finite-state machine described by a graph that represents the set of error events. The post-processor evolves in steps through subsequent transition matrices, deleting at each step the paths that accumulate an invalid number of error events or an excessive number of wrong bits, paths that accumulate a total reliability higher than a given threshold, paths with an invalid check on the received sequence, and paths that reveal an invalid syndrome after having reached a maximum number of events.

17 Claims, 5 Drawing Sheets

Fig. 1

PRIOR ART

Fig. 2

PRIOR ART

PROCESS FOR DECODING SIGNALS AND SYSTEM AND COMPUTER PROGRAM PRODUCT THEREFORE

FIELD OF THE INVENTION

The invention relates to techniques of decoding signals and specifically concerns techniques for decoding digital signals subjected to block coding. Particularly, the invention concerns a technique which is applied when decoding follows another decoding block pertaining to a channel or to another code, e.g. of the convolutional type.

BACKGROUND OF THE INVENTION

Solutions implementing a post-processor after channel detection are currently used in communication systems, also for possible use in signal storage.

Figure 1:
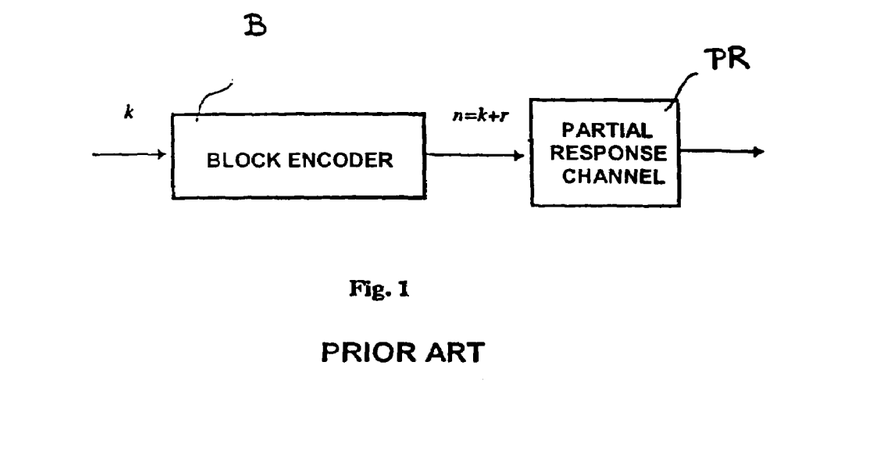

The diagram in FIG. 1 illustrates the typical concatenation between an encoder B which receives an input digital signal organised in blocks of length k and outputs a coded signal organised in blocks comprising n=k+r bits. Generally, an error correction code is a binary block code (n, k) based on an ad hoc parity check matrix H (or polynomial p(D)).

A typical partial response channel PR is shown cascaded to block encoder B.

Creating an optimal detector is not always possible in encoding. This is because the detector is identified by the concatenated effect of the channel and the code trellises. For this reason, sub-optimal implementations are used for decoding. These comprise a dual-stage decoder with post-processor exploiting the knowledge of error events of the channel.

Figure 2:
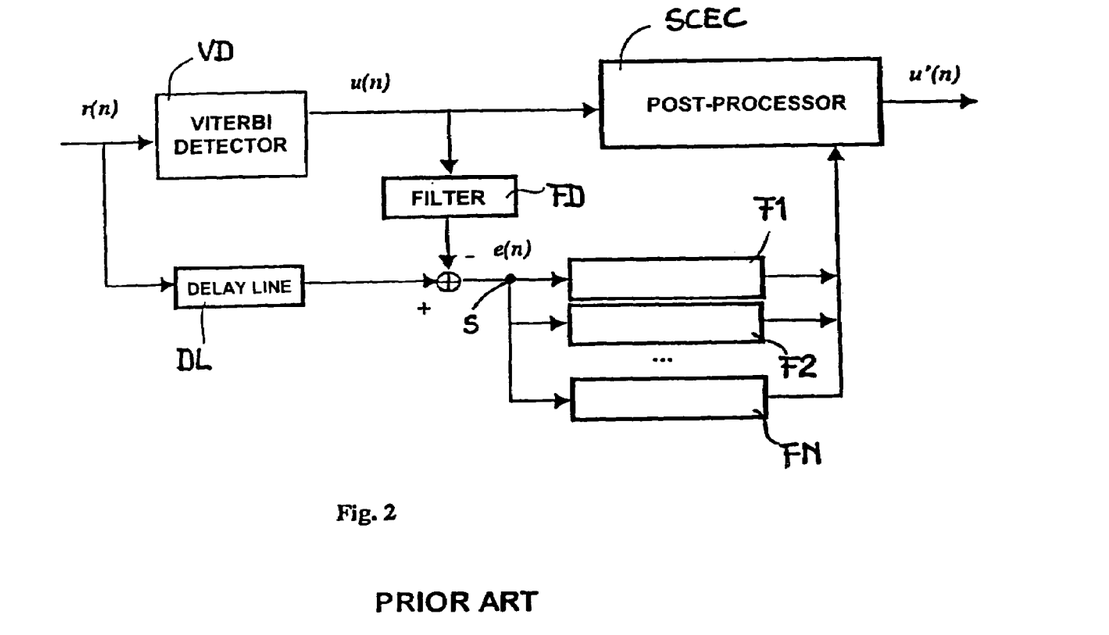

A typical example of decoder based on the use of a post-processor of the traditional type is shown in FIG. 2.

The received signal r(n) is sent to a Viterbi detector VD (or any detector implementing an similar algorithm) so to generate a signal u(n). Before being used as a decoded output signal u'(n), the signal u(n) is passed through a module, herein indicated as SCEC, which implements a syndrome check (SC) and error correction (EC) function.

The SCEC module is controlled by a signal generated by a bank of filters F1, F2, . . . , FN according to an error sequence e(n) generated in a node S. The node S sums with sign (i.e. subtracts) the input signal r(n), delayed via a delay line DL, and the signal u(n) subjected to the filtering function FD corresponding to the considered PR class. The delay line DL compensates the delays set to the signal which reaches the node S with a negative sign by effect of the processing of modules VD and FD.

In the example shown in FIG. 2, the post-processor SCEC receives hard decisions u(n) from the Viterbi detector VD and subjects the respective encoded words to syndrome checking.

If the result of the check is negative, the post-processor attempts to correct the signal on the basis of the syndrome and the most likely error event list. Essentially, the post-processor re-computes the most likely sequence (the sequence closest to the received sequence), which is a channel sequence and which also satisfies the syndrome check. An example of this way of operation is illustrated in detail in WO-A-00/07187.

As shown in FIG. 2, the most frequent channel error events are compared with the error sequence e(n) via the bank of matched filters F1, F2, . . . , FN. The post-processor selects the best correlation between the error sequence and one of the error events described in the filters. The syndrome value determines the type and position of the error events capable of correcting the wrong received codeword.

Other examples of post-processors implementing a filter bank matched to the most likely error events are described in U.S. Pat. Nos. 6,185,173 and 6,185,175.

Another similar post-processor, whose operation is based on the premise of considering and processing reliability information as independent, is described in U.S. Pat. No. 6,061,823.

The post-processor decoders described above are capable of providing entirely satisfying performance in numerous operative contexts. However they are intrinsically vulnerable with respect to correction errors and, particularly, to the possible propagation of such errors.

SUMMARY OF THE INVENTION

The object of the invention is to provide a post-processor capable of overcoming these drawbacks.

According to the invention, this object is achieved by a process having the characteristics specified in the claims which follow.

The invention also relates to the respective system and the corresponding software product, i.e. the product which can be directly loaded into the memory of a digital computer and including software code portions adapted to implement the process of the invention when the product is run on a computer.

The solution according to the invention implements a sub-optimal coder based on the use of available soft data, for example in the context of SISO (Soft Input Soft Output) coding (e.g. the soft version of the Viterbi algorithm—Soft Output Viterbi Algorithm or SOVA). Particularly, there is a correlation between the output errors and their corresponding reliability values by effect of the channel error events statistics. The sub-optimal decoder according to the invention is consequently a post-processor which uses reliability information and the knowledge of channel error events.

In a typical soft decoder, the bit reliability soft quantities are assumed to be independent. Such independence is obtained by means of an interleaver (for example, a block interleaver or a random interleaver in the case of turbo codes).

The invention is not based on the de-correlation of bit reliabilities, but on the contrary uses them to identify the error events.

The solution according to the invention firstly simplifies the decoder structure, thereby overcoming the need for filter banks or error event tables. The invention also offers the possibility of correcting double error events in longer codewords. It is also possible to estimate correction reliability or, for example, detect multiple error events. Finally, the possibility of managing soft data permits the implementation of additional strategies directed at preventing correction errors.

The solution according to the invention can thus be deemed as ideally akin to the solution described in the work by D. Chase, "A Class of Algorithms for Decoding Block Codes with Channel Measurement Information", IEEE Trans. on Inf. Theory, Vol. IT-18, no. 1, pp. 170–182, January 1972.

DETAILED DESCRIPTION OF THE DRAWINGS

The invention will now be described, by way of non-limiting example only, with reference to the annexed drawings wherein:

FIGS. 1 and 2, concerning the prior art, have been described above,

DETAILED DESCRIPTION

Figure 3:
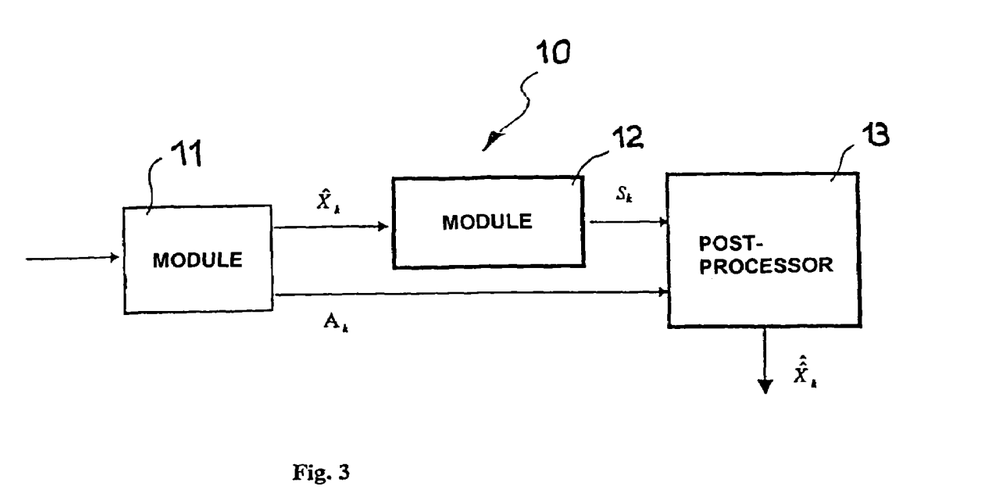
FIG. 3 illustrates the post-processor decoder structure according to the invention in the form of a block diagram, and FIGS. from 4 to 7 illustrate operation of the decoder according to the invention using the typical formal representation of a finite-state machine.

In FIG. 3, numeral 10 generally refers to apparatus intended to be used for decoding digital signals subjected to block coding and transferred on a channel. With reference to this, it is emphasized that for the purpose of this invention, the "channel" does not need to be a (tele)communications channel strictly speaking, but can also be, for example, a medium on which encoded data are stored for a given length of time.

Particularly, the apparatus according to this invention is based on the use of reliability values ("reliability", in short) of a decoder matched to a partial response channel or to a generic code (for example, by means of a SOVA algorithm).

In the diagram of FIG. 3, $X^\wedge_k$ is the vector expressing the estimate of the "kth" encoded word. This vector is sent to a module 12 which computes the syndrome outputting a vector (n–k, 1), called $S_k$, containing the syndrome of the codeword (e.g. given by $X_k^* H^T$, where H is the parity matrix of the code).

Conversely, $A_k$ is the vector derived from the module 11 which expresses the reliability $\alpha_{k,i}$ associated to each bit in the "kth" codeword.

The implementation characteristics and/or criteria of the elements indicated with 11 and 12 are known in the art and need not be described in detail herein.

A post-processor 13 receives vectors $S_k$ and $A_k$ as inputs to generate the estimate subjected to correction, indicated with $X_k^{\wedge\wedge}$, of the codeword.

In this way, as indicated above, the post-processor 13 according to the invention exploits the knowledge of a set of predefined error events associated to their effect on the syndrome.

The post-processor 13 can be implemented (according to intrinsically known criteria) in the form of a so-called finite-state machine. It can consequently be implemented on the basis of detailed indications provided in the following description either by using a dedicated processor or by using a suitably programmed general purpose digital processor (e.g. a DSP).

Particularly, quantities called E and $E_s$ can be defined in order to describe the post-processor 13, wherein:

E is the list (naturally correctable) of the $n_{CH}$ dominating channel error events, and $E_s$ is the matrix ($n_{CH}$, n) containing in the position (i, j) the syndrome caused by the error event i occurring at position j in the codeword (i=1, . . . , $n_{CH}$; j=1, . . . , n).

Correction is based on verifying the error event or the combination of error events which render a valid codeword. The post-processor 13 selects the valid error event with the lowest reliability.

The total reliability $\beta$ of a combination of error events is given by the sum of the reliabilities of the single error events (not of the bits), i.e.:

$$\beta = \Sigma \alpha_{E,k}$$

Particularly, assuming that an error event separates two possible sequences $\underline{y}_1$ and $\underline{y}_2$, the reliability of the final decision (or detection) between $\underline{y}_1$ and $\underline{y}_2$ can be defined as the difference between the two distances in the two sequences with the received signal r, i.e.:

$$\alpha_E = \|\underline{r}-\underline{y}_1\|^2 - \|\underline{r}-\underline{y}_2\|^2$$

If $\underline{y}_1$ is a maximum likelihood sequence which does not respect the parity code limitation (syndrome), the post-processor 13 searches the sequence $\underline{y}_2$ which respects the syndrome and is closest to $\underline{y}_1$. This operation corresponds to calculating the distances between the error events and selecting the minimum distance.

As appears in traditional implementations, this is obtained by means of a bank of filters matched to the errors.

In the solution according to the invention, the reliabilities $\alpha_E$ of the error events are output by the decoder algorithm (SOVA or SISO, in general).

If $\alpha_i$ are the reliabilities of the single bits of an error event (quantities defined so to always be either greater or equal to zero with the zero value associated to the minimum possible reliability), $\alpha_E$ satisfies the following inequality:

$$\alpha_E \geq \max(\alpha_i)$$

This is because the algorithm, such as SOVA, provides the distance from the closest error event concerning each bit.

In practice, $\alpha_E$ is considered equal to the maximum of $\alpha_i$ in the solution according to this invention.

From the definition of distance difference $\alpha_E$ given above, it is clear that error event reliability, and not bit reliability, is used in the post-processor 13. The fact that the reliabilities of the single bits forming the error event are summed is equal to summing the Euclidean distance more than once.

For single error events, implementation is particularly simple. Additionally, the solution according to the invention, as mentioned above, can also be used to treat multiple error events. In a traditional post-processor, this would lead to an exponential computing load, which would be actually insupportable. In actual fact, there are $2^{n-k}/2$ combinations of separate syndromes ($S_1, S_2$) whose sum is equal to S for each syndrome S. Consequently, all double error events with respective syndromes $S_1$ and $S_2$ should be analysed for each combination.

Error events on the boundaries of the codewords must also be taken into account.

Consequently, the solution according to the invention can be used to implement a post-processor capable of treating both single and multiple error events. An Error State Diagram (ESD) is used for this purpose.

The post-processor computes the valid error event combinations capable of correcting the codeword received to select the one with minimum total reliability. Alternatively, the post-processor can provide the list of the first M valid error events and/or a reliability estimate of proposed corrections.

The post-processor according to the invention, implemented in the form of a finite-state machine, can be described in general terms in the form of a graph G representing the set E of error events to be corrected.

Figure 4:
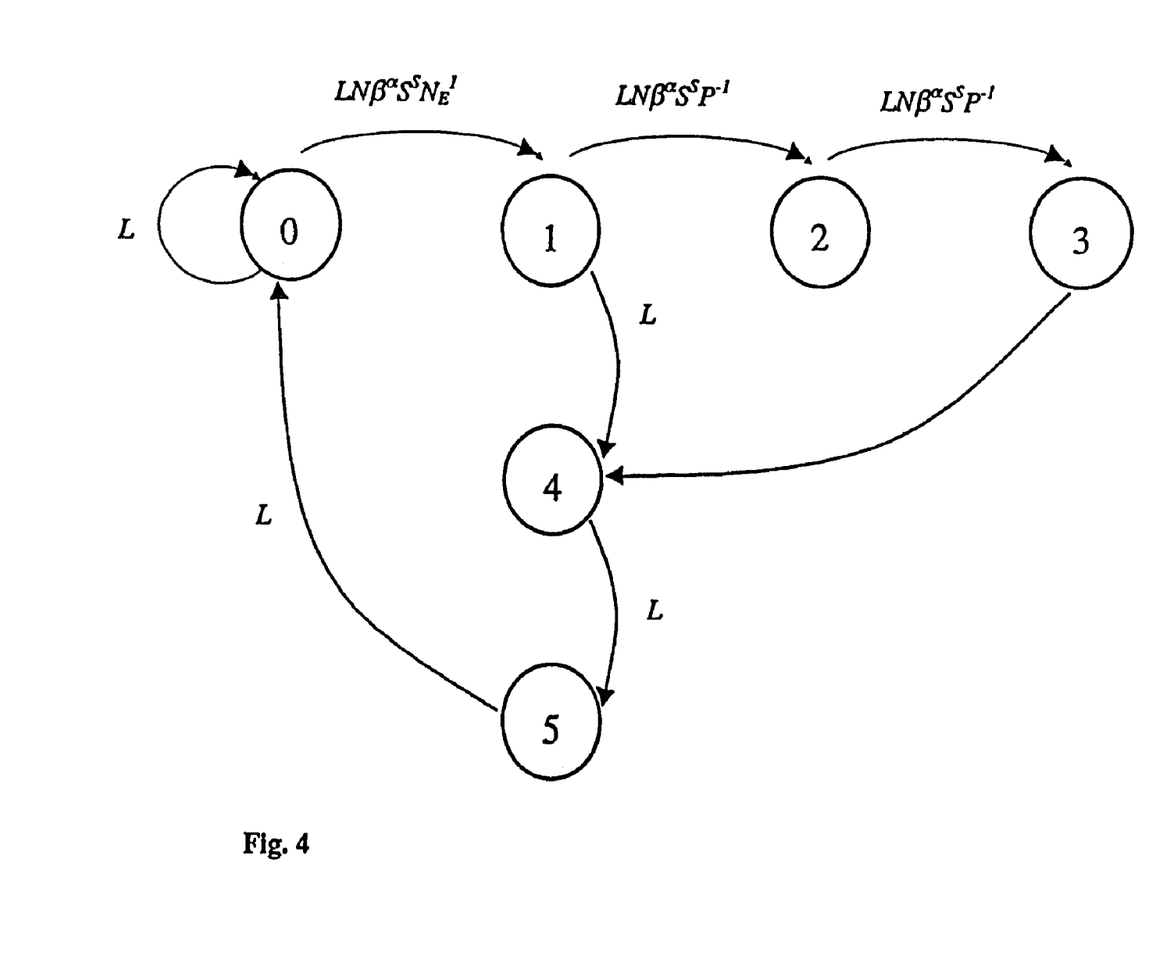

For example, in the chart in FIG. 4, two error events "+" and "++" are hypothesised. State "0" is the "correct state" from which any error event can originate. The particular set of transitions imposes the known structure of the channel error events.

The graph in FIG. 4 can be described in a certain instant k by the transition matrix $G_k$ shown below:

$$Gk = \begin{bmatrix} 0 & LN\beta^{\alpha k}S^{Sk}N_E & 0 & 0 & 0 & 0 \\ 0 & 0 & LN\beta^{\alpha k(1)}S^{Sk}P^{-1} & 0 & L & 0 \\ 0 & 0 & 0 & LN\beta^{\alpha k(2)}S^{Sk}P^{-1} & 0 & 0 \\ 0 & 0 & 0 & 0 & L & 0 \\ 0 & 0 & 0 & 0 & 0 & L \\ 1 & 0 & 0 & 0 & 0 & 0 \end{bmatrix}$$

Each transition label is characterised by 6 variables:

L: the exponent of this variable is the length of the correction pattern and must reach the total length of the codeword.

N: the exponent is the total number of wrong bits in the considered event pattern.

$N_E$: the exponent is the number of error events counted in the concerned error event combination. It must be limited to $N_{MAX}$ (e.g. 1 or 2) to limit the detection of multiple errors.

$\beta_\alpha$: the exponent α contains the total reliability of the correspondent error configuration.

$S^S$: the exponent S contains the total syndrome vector. The initial value is the syndrome of the received codeword $S_0$ (also see the FIG. 5). During estimation, each correction bit provides an update of the total syndrome according to its location in the codeword. This result can also be easily obtained by means of a parity matrix or encoding polynomial. For the purpose of processing, the valid error configurations will present an exponent equal to zero.

P: polarity of the error event, adapted to be used by partial response channels. If the exponent is equal to −1, the current correction bit must be opposite to the previous one (or vice versa for +1).

The post-processor discards the paths which do not satisfy this limitation, by comparing the error patterns generated by the ESD with the received sequence (e.g. a bit received on the channel equal to 0 can be corrected only by a +1 and a bit equal to 1 which can be corrected by a −1).

These labels and their exponents describe the evolution of the various error event combinations: the product of the transition matrices represents this evolution from a mathematical point of view. It is emphasised that the updates of the exponents of the label variables β and S vary at each step because they depend on the position of the bit within the codeword. In other words, different matrices $G_k$ are involved in the product, namely:

$$G = G_1 - G_2 \ldots G_{LC}$$

The various ESD paths show the correction patterns.

The following paths are deleted at each step:

paths which accumulate an invalid number of error events in $N_E$ or an excessive number of wrong bits in N;

paths which accumulate a total reliability higher than a threshold defined in β;

paths which reveal an invalid comparison with reference to the sequence received in P, and paths which reveal an invalid syndrome in S after having reached the maximum number of events $N_{MAX}$.

The post-processor requires a path memory which stores all valid paths for each state. The number of paths of the correct state "0" is limited by the number of syndromes. Only the path with the lowest reliability (in $\beta^\alpha$) must be stored for each error event and for each syndrome which corresponds to an operation of the Viterbi type.

As explained above, the exponent of β must be updated to contain the reliability sum of the single error events and not of the bits. The notation $\alpha_K(n)$ in $G_k$ indicates that the reliabilities of the single error events (e) are obtained by the reliability of the single incorrect bits which comprise them according to the relationship:

$$\alpha_k(n) = max(\alpha_i, \alpha_i \in e)$$

Figure 6:
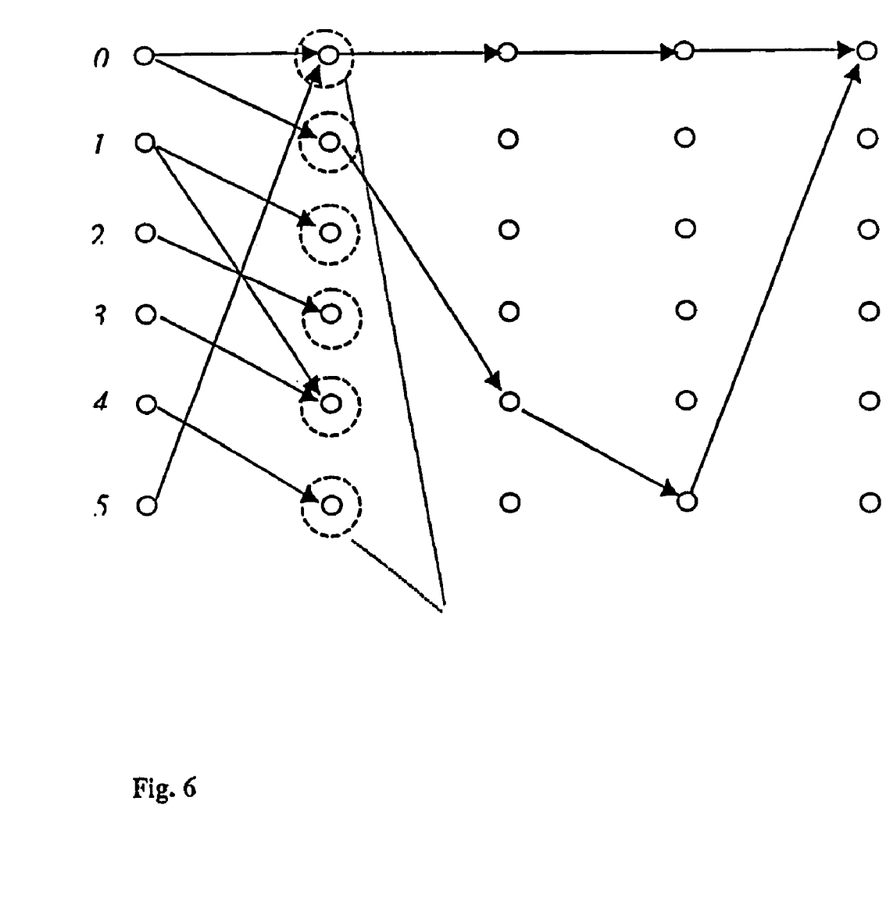

The chart in FIG. 6 shows a Viterbi implementation which can select the valid paths so to respect the aforesaid limitations.

The main differences with respect to a traditional Viterbi solution concern updating several different metrics and the deletion mechanism of paths. This is because the total reliability, the number of error events and the residual syndrome must be updated in this implementation.

The paths which accumulate an invalid metric (particularly as concerns the number of error events and the syndrome) are discarded. Furthermore, for the correction of multiple error events, the Viterbi algorithm must select the path with minimum total reliability among those with the same syndrome.

Figure 5:
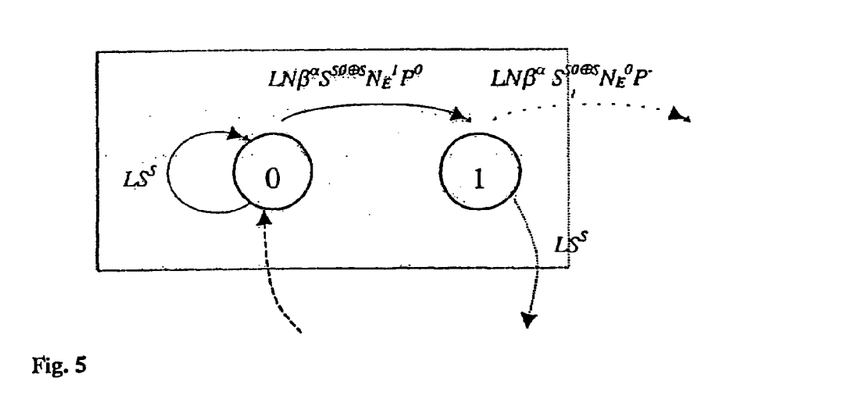

In the case of FIG. 5, the initial conditions mean that only the transitions from "zero" state must be fixed.

In the chart in FIG. 6, the metric update involves the exponent of $N_E$, the reliability α (exponent of β) and the syndrome S. As concerns the path history update, the invalid paths are discarded and in the "zero" state the less reliable one for each syndrome is selected.

A post-corrector can also be implemented for identifying the single error events from a relatively wide list and the double error events only from a limited list, e.g. "+", "++". This result can be obtained by suitably selecting the exponents which either count the error events or implement two parallel trellises, one with several states limited to the single correction and the other with a low number of states but with the possibility of double corrections.

Figure 7:
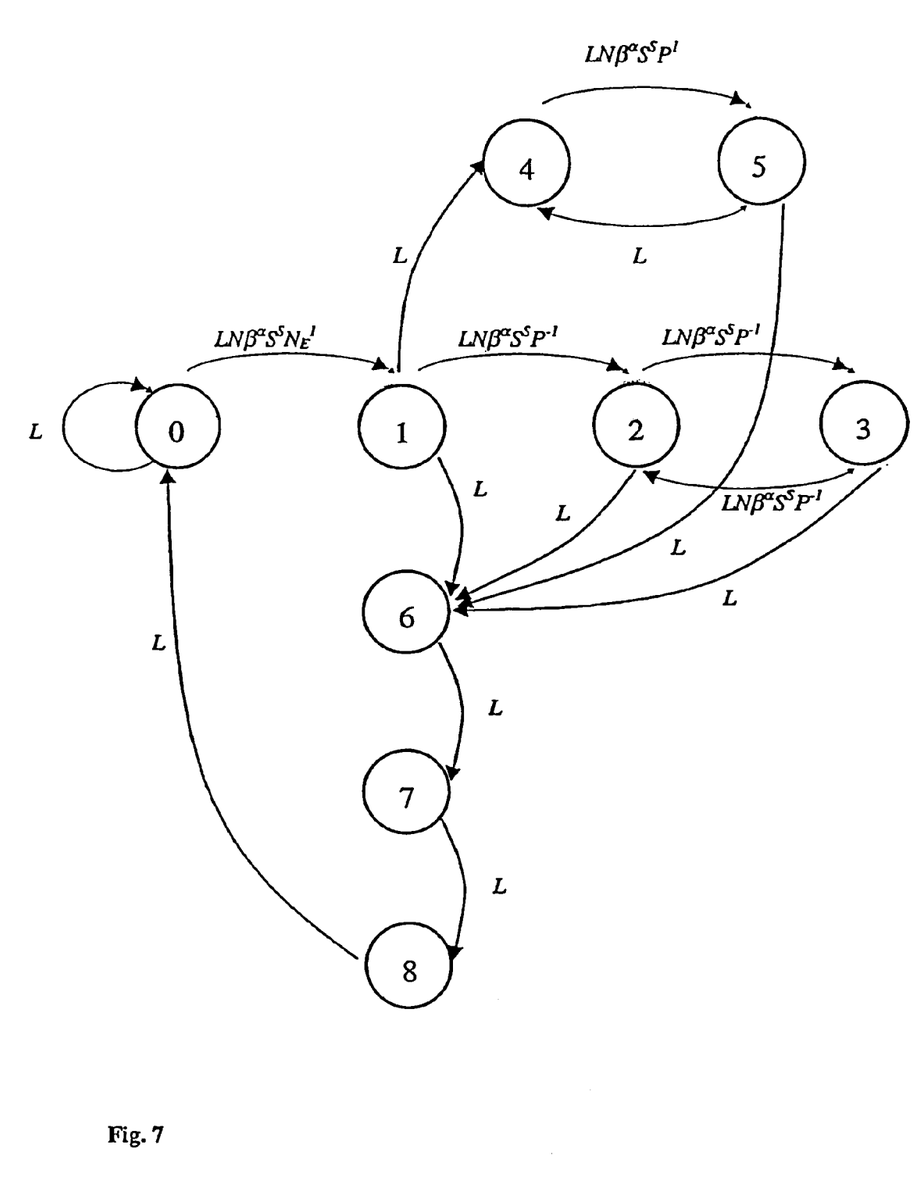

The chart in FIG. 7 shows an example of a graph "adapted" for a more complete list of channel error events.

The chart in FIG. 7 consequently refers to an error event model $+(-+)^n$, $(-+)^n$, $+(0+)^n$.

In general, not all the bits in a codeword need to be processed. The solutions based on soft data often only use the less reliable received bits. This selection considerably limits the number of correction calculations and usually has an acceptable effect on performance.

This approach can also be applied to the solution according to the invention, operating so that not all the bits in the codewords are considered but only the least reliable ones (e.g. bit $L_A$ with $L_A < L_C$, where $L_C$ is the length of the codeword). Alternatively, only the set of bits with reliability under a certain threshold can be considered.

For example, referring to the implementation shown in FIG. 6, only $L_A$ steps can be activated and only the branches with N=0 can be considered valid for the other steps, without updating total reliability and syndromes.

As mentioned, the post-processor diagram described above can be implemented either in the form of a dedicated processor or by using a suitably programmed general purpose processor (e.g. a DSP). The design criteria of this dedicated processor and/or the programming criteria of a DSP to implement the solution described above are within the grasp of a sector expert and do not need to be described in detail herein.

Naturally, numerous changes can be implemented to the construction and forms of embodiment of the invention herein envisaged without departing from the scope of the present invention as defined by the following claims.

What is claimed is:

1. A process for decoding digital signals transferred over a channel, said signals being subjected to block coding and organised in codewords, the process comprising:
   subjecting to correction the codewords affected by error identifying them with a most likely sequence which is a channel sequence and which satisfies a syndrome check;
   providing a set of predefined error events associated to their effect on said syndrome; and
   implementing said correction according to the error event or the combination of error events yielding a valid codeword;
   detecting the reliability of said error events;
   defining the total reliability of a combination of error events as the sum of the reliabilities of the single error events; and
   selecting the combination of error events with the lowest total reliability.

2. The process according to claim 1, further comprising generating a finite-state machine described by a graph representing the set of error events, the set of respective transitions setting the structure of said set of error events.

3. The process according to claim 2, wherein in said graph each transition label is identified by a set of variables comprising:
   the length of the configuration;
   the number of the error events which can be comprised in said combination of error events and the total number of wrong bits;
   the total reliability of the corresponding error configuration;
   the syndrome; and
   the polarity of the error event.

4. The process according to claim 2, wherein said finite-state machine evolves in steps through subsequent transition matrices, deleting at each step the following graph paths:
   paths which accumulate an invalid number of error events or an excessive number of wrong bits;
   paths which accumulate a total reliability higher than a given threshold;
   paths with a invalid check on the received sequence; and
   paths which reveal an invalid syndrome after having reached a maximum number of events.

5. The process according to claim 1, further comprising identifying the single error events from a list of given length and the double error events from a respective list which is shorter than said given length.

6. The process according to claim 1, further comprising considering only the least reliable received bits in said codewords.

7. A system for decoding digital signals transferred over a channel, said signals being subjected to block coding and organised in codewords, the system comprising:
   a post-processor which corrects the codewords affected by error, identifying them with a most likely sequence which is a channel sequence and which satisfies a syndrome check; said post-processor further comprising
      means for providing a set of predefined error events associated to their effect on said syndrome,
      means for implementing said correction according to the error event or the combination of error events yielding a valid codeword;
      means for detecting the reliability of said error events;
      means for defining the total reliability of a combination of error events as the sum of the reliabilities of single error events; and
      means for selecting the combination of error events with the lowest total reliability.

8. The system according to claim 7, wherein said post-processor comprises a finite-state machine described by a graph representing the set of error events, the set of respective transitions setting the structure of said set of error events event set.

9. The system according to claim 8, wherein in said graph each transition label is identified by a set of variables comprising:
   the length of the configuration;
   the number of the error events which can be comprised in said combination of error events and the total number of wrong bits;
   the total reliability of the corresponding error configuration;
   the syndrome; and
   the polarity of the error event.

10. The system according to claim 8, wherein said post-processor evolves in steps through subsequent transition matrices, deleting at each step the following graph paths:
    paths which accumulate an invalid number of error events or an excessive number of wrong bits;
    paths which accumulate a total reliability higher than a given threshold;
    paths with a invalid check on the received sequence; and
    paths which reveal an invalid syndrome after having reached a maximum number of events.

11. The system according to claim 7, wherein said post-processor further comprises means for identifying the single error events from a list of given length and the double error events from a respective list which is shorter than said given length.

12. The system according to claim 7, wherein said post-processor comprises means for processing only the least reliable received bits in said encoded words.

13. A computer program product directly loadable into the internal memory of a digital computer and comprising software code portions for performing the process according to claim 1 when said product is run on a computer.

14. A process for decoding digital signals transferred over a channel, said signals being subjected to block coding and organised in codewords, the process comprising:
    subjecting to correction the codewords affected by error identifying them with a most likely sequence which is a channel sequence and which satisfies a syndrome check;
    providing a set of predefined error events associated to their effect on said syndrome;
    implementing said correction according to the error event or the combination of error events yielding a valid codeword; and
    generating a finite-state machine described by a graph representing the set of error events, the set of the respective transitions setting the structure of said set of error events,
wherein in said graph each transition label is identified by a set of variables comprising:
    the length of the configuration;
    the number of the error events which can be comprised in said combination of error events and the total number of wrong bits;
    the total reliability of the corresponding error configuration;

the syndrome; and the polarity of the error event.

15. A process for decoding digital signals transferred over a channel, said signals being subjected to block coding and organised in codewords, the process comprising:

subjecting to correction the codewords affected by error identifying them with a most likely sequence which is a channel sequence and which satisfies a syndrome check;

providing a set of predefined error events associated to their effect on said syndrome; and     implementing said correction according to the error event or the combination of error events yielding a valid codeword; and     generating a finite-state machine described by a graph representing the set of error events, the set of the respective transitions setting the structure of said set of error events, wherein said finite-state machine evolves in steps through subsequent transition matrices, deleting at each step the following graph paths:

paths which accumulate an invalid number of error events or an excessive number of wrong bits;

paths which accumulate a total reliability higher than a given threshold;

paths with a invalid check on the received sequence; and     paths which reveal an invalid syndrome after having reached a maximum number of events.

16. A system for decoding digital signals transferred over a channel, said signals being subjected to block coding and organised in codewords, the system comprising:

a post-processor which corrects the codewords affected by error, identifying them with a most likely sequence which is a channel sequence and which satisfies a syndrome check; said post-processor further comprising     means for providing a set of predefined error events associated to their effect on said syndrome, and     means for implementing said correction according to the error event or the combination of error events yielding a valid codeword,     wherein said post-processor comprises a finite-state machine described by a graph representing the set of error events, the set of respective transitions setting the structure of said set of error events, and wherein in said graph each transition label is identified by a set of variables comprising:

the length of the configuration;

the number of the error events which can be comprised in said combination of error events and the total number of wrong bits;

the total reliability of the corresponding error configuration;

the syndrome; and the polarity of the error event.

17. A system for decoding digital signals transferred over a channel, said signals being subjected to block coding and organised in codewords, the system comprising:

a post-processor which corrects the codewords affected by error, identifying them with the most likely sequence which is a channel sequence and which satisfies a syndrome check; said post-processor further comprising     means for providing a set of predefined error events associated to their effect on said syndrome, and     means for implementing said correction according to the error event or the combination of error events yielding a valid codeword, wherein said post-processor comprises a finite-state machine described by a graph representing the set of error events, the set of respective transitions setting the structure of said set of error events, and wherein said post-processor evolves in steps through subsequent transition matrices, deleting at each step the following graph paths:

paths which accumulate an invalid number of error events or an excessive number of wrong bits;

paths which accumulate a total reliability higher than a given threshold;

paths with a invalid check on the received sequence; and     paths which reveal an invalid syndrome after having reached a maximum number of events.

\* \* \* \* \*